(12) United States Patent
Nihart et al.

(10) Patent No.: US 11,731,154 B2
(45) Date of Patent: Aug. 22, 2023

(54) MODULAR HOOD FOR COATING GLASS CONTAINERS INCLUDING REMOVABLE DIVIDERS FOR AFFECTING AIR FLOW THROUGH THE HOOD

(71) Applicant: Arkema Inc., King of Prussia, PA (US)

(72) Inventors: Jeremy J. Nihart, Pottstown, PA (US); Ryan C. Smith, Schwenksville, PA (US)

(73) Assignee: Arkema Inc., King of Prussia, PA (US)

( * ) Notice: Subject to any disclaimer, the term of this patent is extended or adjusted under 35 U.S.C. 154(b) by 1 day.

(21) Appl. No.: 17/399,522

(22) Filed: Aug. 11, 2021

(65) Prior Publication Data

US 2021/0370333 A1 Dec. 2, 2021

Related U.S. Application Data

(63) Continuation of application No. 16/498,414, filed as application No. PCT/US2018/024420 on Mar. 27, 2018, now Pat. No. 11,117,154.

(Continued)

(51) Int. Cl.
*B05B 14/40* (2018.01)
*B05B 16/40* (2018.01)
(Continued)

(52) U.S. Cl.
CPC ............... *B05B 14/40* (2018.02); *B05B 5/08* (2013.01); *B05B 12/18* (2018.02); *B05B 12/36* (2018.02); *B05B 13/0221* (2013.01); *B05B 13/0447* (2013.01); *B05B 16/00* (2018.02); *B05B 16/40* (2018.02); *B05B 16/60* (2018.02); *B05B 16/90* (2018.02); *B05C 15/00* (2013.01); *C03C 17/005* (2013.01); *C23C 16/45502* (2013.01);
(Continued)

(58) Field of Classification Search
CPC ............................. Y10S 118/07; B05B 16/40
USPC ............................................................. 55/46
See application file for complete search history.

(56) References Cited

U.S. PATENT DOCUMENTS 1,603,878 A * 10/1926 Smith .................... B01D 45/08
55/423
3,842,793 A 10/1974 Novice et al.
(Continued)

FOREIGN PATENT DOCUMENTS

CN 201952490 U 8/2011
CN 104254663 A 12/2014
(Continued)

OTHER PUBLICATIONS

European Examination Report for European Application No. 18 775 794.3, dated Sep. 21, 2021, 3 pages.

*Primary Examiner* — Karl Kurple
(74) *Attorney, Agent, or Firm* — RatnerPrestia (57) ABSTRACT

A modular apparatus for coating glass articles with a chemical compound includes a coating hood section (10*a*) including a series of interconnected walls (12) defining an interior chamber (18, 20*a*, 20*b*) having an inlet (32) and an outlet (44), a blower (24) positioned at least partially in the interior chamber (18, 20*a*, 20*b*) to carry air from the inlet (32) towards the outlet (44); and a connector (50) for connecting the coating hood section (10*a*) to an identical coating hood section (10*b*). The connector (50) for connecting being defined on at least one of the interconnected walls (12) of the coating hood section (10*a*).

17 Claims, 11 Drawing Sheets

Related U.S. Application Data (60) Provisional application No. 62/479,346, filed on Mar. 31, 2017.

(51) Int. Cl.

| | | |
|---|---|---|
| *B05B 16/60* | (2018.01) | |
| *B05C 15/00* | (2006.01) | |
| *C03C 17/00* | (2006.01) | |
| *B05B 16/00* | (2018.01) | |
| *B05B 13/04* | (2006.01) | |
| *B05B 5/08* | (2006.01) | |
| *B05B 12/18* | (2018.01) | |
| *B05B 12/36* | (2018.01) | |
| *B05B 13/02* | (2006.01) | |
| *C23C 16/455* | (2006.01) | |
| *B05D 3/04* | (2006.01) | |

(52) U.S. Cl.
CPC ............ *B05D 3/04* (2013.01); *B05D 2203/35* (2013.01); *Y10S 55/46* (2013.01); *Y10S 118/07* (2013.01)

(56) References Cited

U.S. PATENT DOCUMENTS

| | | | |
|---|---|---|---|
| 3,951,100 A | 4/1976 | Sopko et al. | |
| 4,389,234 A | 6/1983 | Lindner et al. | |
| 4,431,692 A | 2/1984 | Hofmann et al. | |
| 4,668,268 A | 5/1987 | Lindner et al. | |
| 4,946,718 A | 8/1990 | Napadow | |
| 5,023,116 A | 6/1991 | Williams et al. | |
| 5,081,953 A | 1/1992 | Guthrie et al. | |
| 5,140,940 A | 8/1992 | Lindner et al. | |
| 5,454,873 A | 10/1995 | Scholes et al. | |
| 5,584,903 A | 12/1996 | Guthrie et al. | |
| 5,599,369 A | 2/1997 | Townsend et al. | |
| 6,120,573 A * | 9/2000 | Call | B01D 45/08 55/444 |
| 6,230,470 B1 | 5/2001 | Kimmerle et al. | |
| 7,004,998 B2 * | 2/2006 | Scherrer | B01D 45/08 95/267 |
| 8,541,055 B2 | 9/2013 | Kutilek et al. | |
| 9,080,403 B2 | 7/2015 | Xu et al. | |
| 2006/0011747 A1 | 1/2006 | Jahnke et al. | |
| 2008/0032051 A1 | 2/2008 | Hutchinson et al. | |
| 2009/0001026 A1 | 1/2009 | Spangler | |
| 2009/0194027 A1 | 8/2009 | Heimel et al. | |
| 2011/0159199 A1 | 6/2011 | McLean et al. | |
| 2011/0250360 A1 | 10/2011 | Kormoci et al. | |
| 2011/0250364 A1 | 10/2011 | Yamaguchi et al. | |
| 2015/0101537 A1 | 4/2015 | Fahey | |
| 2017/0113240 A1 | 4/2017 | Jegust et al. | |
| 2017/0136489 A1 | 5/2017 | Maeda | |
| 2020/0001217 A1 * | 1/2020 | Savage | B01D 45/08 |

FOREIGN PATENT DOCUMENTS

| | | |
|---|---|---|
| EP | 2657201 A1 | 10/2013 |
| FR | 3009975 A1 | 3/2015 |
| GB | 1454379 A | 11/1976 |
| JP | S4989717 A | 8/1974 |
| JP | 5827215 82 | 6/1983 |
| JP | 2009197329 A | 9/2009 |
| WO | 0125503 A1 | 4/2001 |
| WO | 2004004929 A1 | 1/2004 |
| WO | 2006052659 A2 | 5/2006 |

* cited by examiner

MODULAR HOOD FOR COATING GLASS CONTAINERS INCLUDING REMOVABLE DIVIDERS FOR AFFECTING AIR FLOW THROUGH THE HOOD

CROSS-REFERENCE TO RELATED APPLICATIONS

This application is a continuation of U.S. patent application Ser. No. 16/498,414, filed Sep. 27, 2019, which is the U.S. national phase application filed under 35 U.S.C. § 371 claiming benefit to International Patent Application No. PCT/US18/024420, filed Mar. 27, 2018, which is entitled to priority under 35 U.S.C. § 119(e) to U.S. Provisional Patent Application No. 62/479,346, filed Mar. 31, 2017, the contents of these applications being hereby incorporated herein by reference in their entirety.

FIELD OF THE INVENTION

This invention relates to a modular coating hood for coating glass containers. The adjustable modular coating hood for coating glass containers comprises at least two or more removably and/or releasably connected sections. The at least two sections connect to each other to provide a modular apparatus for coating glass articles with a chemical compound and may be disassembled and reconnected as desired. The removably and/or releasably connected sections preferably are substantially identical or more preferably identical.

BACKGROUND OF THE INVENTION

In the process of manufacturing a glass container, the exterior surface of the glass container is typically coated with a metal-oxide coating, for example, to improve its structural integrity.

The coating process is traditionally performed in a coating hood. Coating hoods are disclosed in U.S. Patent Application Pub. No. 2015/0101537; U.S. Pat. Nos. 4,389,234; 5,081,953; 5,140,940; 5,454,873; 5,599,369; 5,584,903; and PCT Patent App. Pub. No. WO1996020142, for example, each of which is incorporated herein by reference in its entirety. In an assembly line style operation, coating vapor is sprayed onto the exterior surface of a glass container as the glass container passes through a tunnel formed in a coating hood.

Due to fabrication, inventory and internal capital constraints, coating hood manufacturers ordinarily supply coating hoods in a limited number of specific fixed lengths, e.g., two foot length, eight foot length, etc., and the customers select the most appropriate fixed length for their current application. In many situations, a customer is provided with a coating hood that is either too large or barely sufficient for their current need. The customer can not readily alter the length of the coating hood. Also, due to the long operating lifetime of coating hoods, customers are also restricted to using the same fixed length hood when their productions schedules change.

In view of the foregoing, there exists a need in the industry, particularly the glass coating industry, to provide an adjustable coating hood for coating glass containers which is readily and easily modified by the user depending upon user needs and which is easily cleaned and serviced. The apparatus may be used for hot or cold end coatings of containers.

SUMMARY OF THE INVENTION

Various aspects and embodiment of the invention may be summarized as follows:

Aspect 1: A modular apparatus for coating glass articles with a chemical compound is provided. The modular apparatus comprises: a coating hood section (10*a*) including a series of interconnected walls (12) defining an interior chamber (18, 20*a*, 20*b*) having an inlet (32) and an outlet (44), a blower (24) positioned at least partially in the interior chamber (18, 20*a*, 20*b*) to carry air from the inlet (32) towards the outlet (44); and means (50) for connecting the coating hood section (10*a*) to an identical coating hood section (10*b*), said means (50) for connecting being defined on at least one of the interconnected walls (12) of the coating hood section (10*a*).

Aspect 2: The modular apparatus of aspect 1, wherein said means (50) for connecting are positioned on opposing side walls of the coating hood section.

Aspect 3: The modular apparatus of aspect 1 or 2, wherein said means for connecting are selected from the group consisting of a connector, a slot, a tang, a tab, a bolt, an opening, a fastener, a screw, a raised surface, a clamp, a clip, a magnet, and a protrusion.

Aspect 4: The modular apparatus of any of aspects 1-3, wherein said identical apparatus (10*b*) comprises said means (50) for connecting, and said means (50) for connecting on said identical coating hood section (10*b*) are configured to be releasably connected to said means (50) for connecting on said coating hood section (10*a*).

Aspect 5: The modular apparatus of any of aspects 1-4, wherein the interior chamber (18, 20*a*, 20*b*) comprises a suction chamber (20*a*) communicating with said inlet (32), and a blowing chamber (20*b*) communicating with said outlet (44).

Aspect 6: The modular apparatus of aspect 5, wherein the interior chamber (18, 20*a*, 20*b*) comprises a transfer chamber (18) communicating with said suction chamber (20*a*) and said blowing chamber (20*b*).

Aspect 7: The modular apparatus of aspect 6, wherein the blower (24) is at least partially positioned in the transfer chamber (18).

Aspect 8: The modular apparatus of aspect 5, wherein the suction chamber (20*a*) includes a series of individual slots (36) through which the chemical compound passes, and the blowing chamber (20*b*) includes a series of individual slots (48) through which the chemical compound passes.

Aspect 9: The modular apparatus of aspect 5, wherein an injector (420) is positioned to deliver the chemical compound into the blowing chamber (20*b*).

Aspect 10: The modular apparatus of aspect 5, further comprising a divider (22) positioned between the blowing chamber (20*b*) and the suction chamber (20*a*).

Aspect 11: The modular apparatus of aspect 6, further comprising a wall (31) dividing the transfer chamber (18) from the blowing chamber (20*b*) and the suction chamber (20*a*).

Aspect 12: A method for assembling two identical coating hood sections (10*a*, 10*b*) together comprising:

connecting a means (50) for connecting on one of the two identical coating hoods (10*a*, 10*b*) to a means (50) for connecting on the other of the two identical coating hoods (10*a*, 10*b*).

Aspect 13: The method of aspect 12 further comprising:
connecting a means (50) for connecting of another identical coating hood (10a, 10b) to another means (50) for connecting on the other of the two identical coating hoods (10a, 10b).

Aspect 14: A method for disassembling two identical coating hood sections (10a, 10b) comprising:
disconnecting a means (50) for connecting on one of the two identical coating hoods (10a, 10b) from a means (50) for connecting on the other of the two identical coating hoods (10a, 10b).

Aspect 15: The method of aspect 14 further comprising:
disconnecting a means (50) for connecting of another identical coating hood (10a, 10b) from another means (50) for connecting on the other of the two identical coating hoods (10a, 10b).

Aspect 16: A modular apparatus for coating glass articles with a chemical compound, said modular apparatus comprising at least two removably and/or releasably connected sections.

Aspect 17. The modular apparatus of aspect 16 wherein said at least two removably and/or releasably connected sections are connected to each other to provide said modular apparatus for coating glass articles with a chemical compound, or which are removed or released for disassembly.

Aspect 18. The modular apparatus of aspect 16 wherein said at least two removably or reliably connected sections are substantially identical or identical.

BRIEF DESCRIPTION OF THE DRAWING FIGURES

The invention is best understood from the following detailed description when read in connection with the accompanying drawing. Included in the drawing are the following figures.

DETAILED DESCRIPTION OF THE DRAWING FIGURES

The invention is best understood from the following detailed description when read in connection with the accompanying drawing figures, which shows exemplary embodiments of the invention selected for illustrative purposes. The invention will be illustrated with reference to the figures. Such figures are intended to be illustrative rather than limiting and are included herewith to facilitate the explanation of the present invention.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both removable or rigid attachments or relationships, unless expressly described otherwise.

Figure 1:
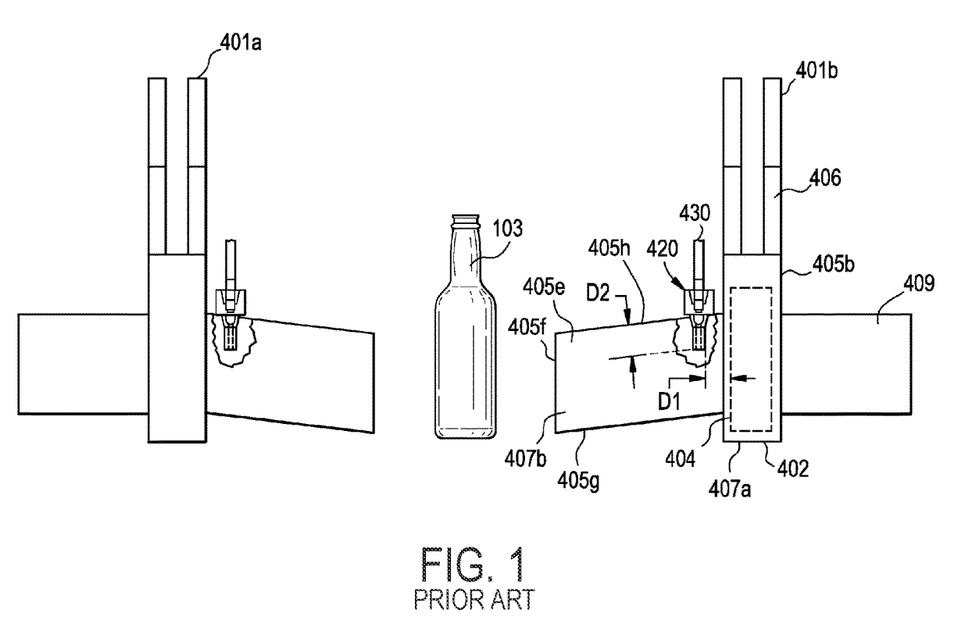
FIGS. 1, 2 and 3 show a partially schematic view of a double-vapor-loop coating hood for bottles according to the prior art.
Figure 2:
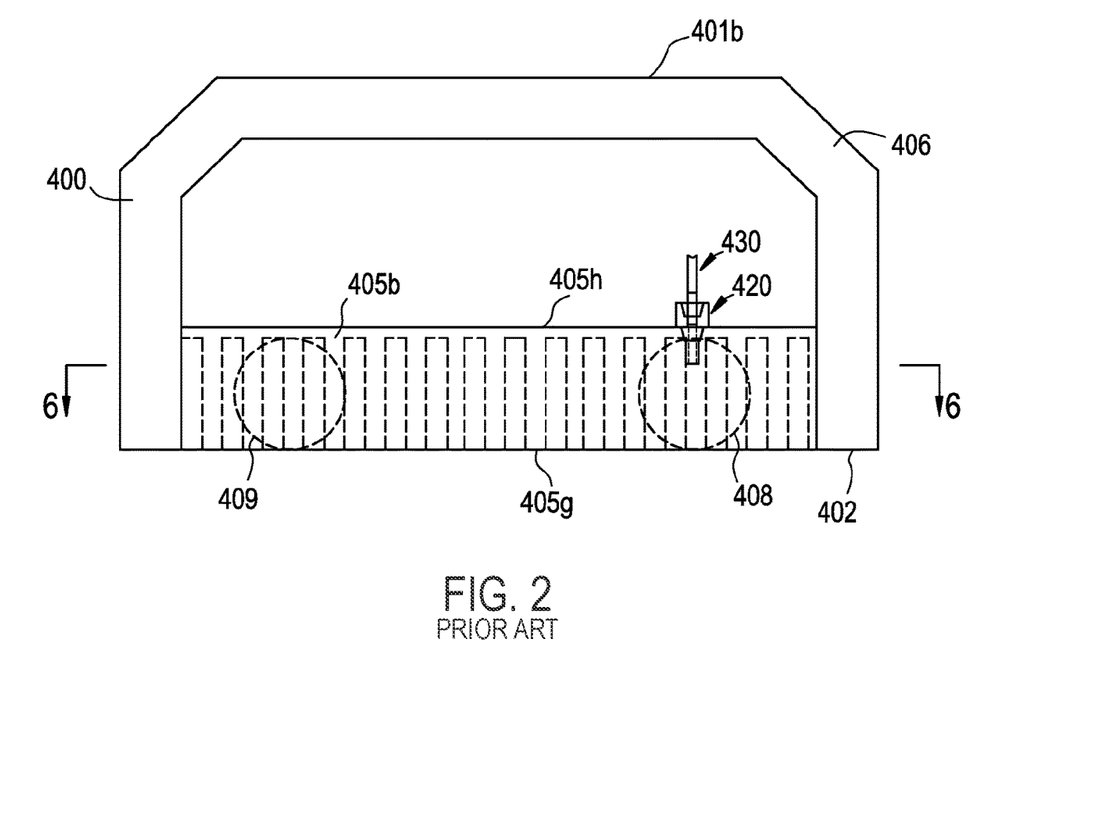
Figure 3:
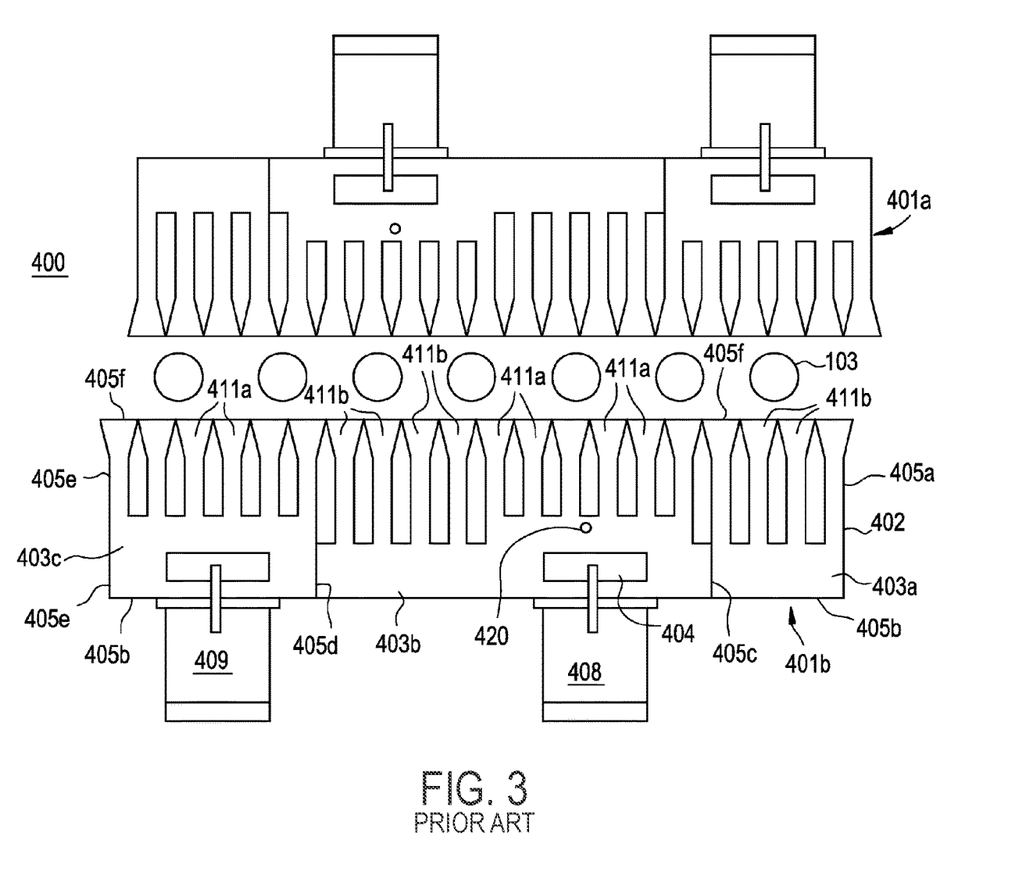

The present invention will be best understood by a brief initial discussion of a coating hood of the prior art. FIGS. 1-3 show a partially schematic view of a double-vapor-loop coating hood 400 for bottles according to U.S. Pat. No. 4,389,234, the entirety of which is incorporated by reference herein. The coating hood 400 generally includes two opposing hood sections 401*a* and 401*b* that are substantially identical. Although not shown, a central hood portion is positioned between the opposing hood sections 401*a* and 401*b*. Further details of the central hood portion can be found in U.S. Pat. No. 4,668,268, which is incorporated by reference in its entirety for all purposes. The bottles 103 pass through an enclosed space that is defined between the opposing hood sections 401*a* and 401*b*. The enclosed space limits the escapement of the coating compound into the atmosphere.

The features of the hood section 401*b* will be described hereinafter, however, it should be understood that the hood sections 401*a* and 401*b* are substantially identical. Thus, the foregoing description of the hood section 401*b* also applies to hood section 401*a*. The hood section 401*b* includes a plenum housing 402. The plenum housing 402 includes a rectangular shaped base portion 407*a* and a manifold portion 407*b* that extends from the front end of the base portion 407*a*.

As best shown in FIGS. 2 and 3, three substantially enclosed interior chambers 403*a*-403*c* are defined in the plenum housing 402. The interior chamber 403*a* of the housing 402 is defined by the following walls of the housing 402: top wall 405*h*, bottom wall 405*g*, front wall 405*f*, outer wall 405*a*, rear wall 405*b*, and interior wall 405*c*. The interior chamber 403*b* of the housing 402 is defined by the following walls of the housing 402: top wall 405*h*, bottom wall 405*g*, front wall 405*f*, interior wall 405*c*, interior wall 405*d*, and rear wall 405*b*. Lastly, the interior chamber 403*c* of the housing 402 is defined by the following walls of the housing 402: top wall 405*h*, bottom wall 405*g*, front wall 405*f*, outer wall 405*e*, rear wall 405*b*, and interior wall 405*d*.

Referring to FIGS. 2 and 3, the interior chambers 403*a* and 403*c* are in fluid communication by virtue of a C-shaped hollow passage 406. Thus, fluid vapors travel from interior chamber 403*a* to chamber 403*c* via hollow passage 406.

Referring now to FIG. 3, a series of openings or slots 411*a* and 411*b* are defined on the front wall 405*f* of the plenum housing 402. Slots 411*a* are configured as blowing slots, whereas slots 411*b* are configured as suction slots. The blowing slots 411a may be referred to herein as an outlet or outlets, and the suction slots 411b may be referred to herein as an inlet or inlets.

Two blowers 408 and 409 are mounted to the housing 402. Each blower 408 and 409 has a rotating fan blade 404 that is attached to a motor by a shaft. The fan blade 404 of the blower 408 is positioned in interior chamber 403b, and the fan blade 404 of the blower 408 is positioned in interior chamber 403c. The motors of the blowers 408 and 409 are optionally positioned outside of the housing 402.

As shown in FIG. 1, an injector 420 is mounted to the top wall 405h of the housing 402 adjacent to the fan blade 404 of the blower 408. The proximal end of the injector 420 is fluidly connected to a conduit 430 (a portion of which is shown) through which liquid coating chemical is distributed from a liquid coating supply (not shown). In FIG. 1, the side wall 405e of the housing 402 is partially cut-away to reveal the distal end of the injector 420.

The distal end of the injector 420 of the hood section 401b is positioned downstream of the blower fan blade 404, and is spaced axially by a distance 'D1' from the blower fan blade 404. The distal end of the injector 420 extends into the interior of the manifold portion 407b of the housing 402 by a distance 'D2.'

Figure 4:
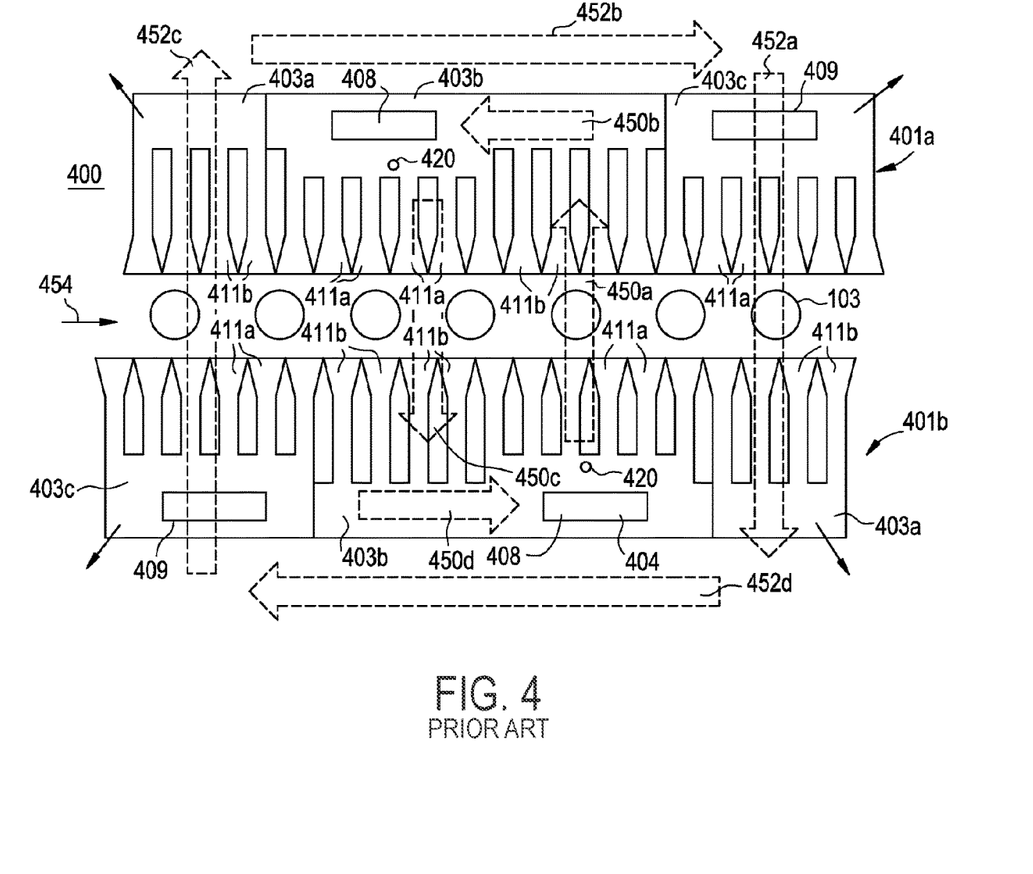
FIG. 4 depicts a method of operating the double vapor loop coating hood of FIGS. 1-3 according to the prior art.

Referring to FIG. 4, according to one method of operating the double vapor loop coating hood 400, the blowers 408 and 409 of each hood section 401a and 401b are first activated. The coating chemical is then delivered into the chamber 403b of each hood section 401a and 401b via the injectors 420. Thereafter the bottles 103 are conveyed along a path between the hood sections 401a and 401b, as indicated by arrow 454.

As noted above, the coating hood 400 has a double vapor loop. The primary loop 450 is depicted by air streams 450a-450d, whereas, the recycle loop 452 is depicted by air streams 452a-452d.

In the primary loop 450, the pressure side of the blowers 408 in the hood sections 401a and 401b propel air streams 450c and 450a past the injectors 420 of the hood sections 401a and 401b, respectively. Upon mixing with the coating chemical that is distributed by the injectors 420, the air streams 450c and 450a become entrained with vaporized coating chemical. The coating entrained air streams 450c and 450a are propelled out of the blowing slots 441a that are associated with the interior chambers 403b of the hood sections 401a and 401b, respectively, by the pressure side of the blowers 408. The coating entrained streams 450c and 450a pass over the bottles 103 that are positioned in front of those blowing slots 441a that are associated with the interior chambers 403c of the hood sections 401a and 401b, respectively, thereby coating the bottles 103 with the vaporized coating chemical.

The vacuum side of the blowers 408 of the hood sections 401a and 401b draws the air streams 450a and 450c through the suction slots 441b and into the interior chambers 403b of the hood sections 401a and 401b, respectively. The vacuum side of the blowers 408 of the hood sections 401a and 401b draws the coating entrained air streams 450b and 450d through the interior chambers 403 of the hood sections 401a and 401b, respectively. The primary loop then repeats as the pressure side of the blowers 408 propels the air streams 450c and 450a past the injectors 420 of the hood sections 401a and 401b, respectively.

As described above, the coating entrained air streams 450a and 450c contact the bottles 103. As the coating entrained air streams 450a and 450c contact the bottles 103, a portion of the coating entrained air streams 450a and 450c scatters outward toward the outer periphery of the hood sections. That scattered portion of the coating entrained air streams 450a and 450c is captured in the recycle loop 452.

In the recycle loop 452, the pressure side of the blowers 409 in the hood sections 401a and 401b propel air streams 452a and 452c out of the blowing slots 441a that are associated with the interior chambers 403c of the hood sections 401a and 401b, respectively. The air streams 452a and 452c mix with the scattered portion of the coating entrained air streams 450a and 450c of the primary loop 450. The coating entrained streams 452a and 452c of the recycle loop 452 pass over the bottles 103 that are positioned in front of those blowing slots 441a that are associated with the interior chambers 403c of the hood sections 401a and 401b, respectively, thereby twice coating the bottles 103 with the vaporized coating chemical.

As noted previously, the interior chambers 403a and 403c of each hood section are fluidly connected by passage 406. Thus, it follows that the vacuum side of the blowers 409 that are positioned in the interior chambers 403c of the hood sections 401b and 401a draw the coating entrained air streams 452a and 452c through the suction slots 441b that are associated with the interior chambers 403a of the hood sections 401b and 401a, respectively. The vacuum side of the blowers 409 then draw the air streams 452d and 452b through the passage 406 and into the interior chambers 403c of the hood sections 401b and 401a, respectively. The recycle loop then repeats as the pressure side of the blowers 409 in the hood sections 401a and 401b propel air streams 452a and 452c out of the blowing slots 441a that are associated with the interior chambers 403c of the hood sections 401a and 401b, respectively.

As described in the Background section, each hood section 401 is an integral unit having a fixed length. Each hood section 401 includes two blowers 408/409 and at least three chambers 403. It is neither possible nor practicable to disassemble a portion of an individual hood section 401 for cleaning, service or repair.

Turning now to the instant invention as exemplified in FIGS. 5-8, these figures depict a coating hood 10 for bottles. It is noted that various manifold walls are shown cut-away in FIGS. 5 and 6. It is further noted that these figures and the following description provide embodiment(s) which may be preferred. These embodiment(s) are non limiting examples, however, and the invention includes configurations and elements which may vary from those shown and described, including for example in size, shape, number, and arrangement of the various elements described and depicted herein.

The coating hood 10 generally includes at least two or more opposing hood sections 10a and 10b. Preferably, the hood sections 10a and 10b are identical or substantially identical. Although not shown, a central hood portion is positioned between the opposing hood sections 10a and 10b. Further details of the central hood portion can be found in, for example, U.S. Pat. No. 4,668,268, which is incorporated by reference in its entirety for all purposes. The bottles 103 pass through an enclosed space that is defined between the opposing hood sections 10a and 10b. The enclosed space limits the escapement of the coating compound into the atmosphere.

The features of the hood section 10a will be described hereinafter, however, it should be understood that preferably the hood sections 10a and 10b are identical or substantially identical. Thus, the foregoing description of the hood section 10a also applies to hood section 10b.

The hood section 10a includes a plenum housing 12, and a single blower 24 that is mounted to the plenum housing 12.

The plenum housing 12 includes, for example, a substantially rectangular-shaped base portion 14 and a manifold portion 16 that extends from the front end of the base portion 14. The base portion 14 and the manifold portion 16 are interconnected by welds, for example. The plenum housing 12 may be formed from steel or aluminum sheet metal panels, for example.

A single substantially rectangular-shaped interior transfer chamber 18 is defined in the base portion 14. The fan blade blades 26 of the blower 24 are positioned within the interior chamber 18. The blower 24 operates in the reverse direction as that shown in FIG. 4, however, it should be understood that the blower 24 may be operated in the same direction as that shown in FIG. 4.

Two chambers 20a and 20b are defined in the manifold portion 16 and are physically separated by divider 22. The suction chamber 20a of the manifold portion 16 is partially enclosed by the walls of the housing 12 including divider 22. The suction chamber 20a extends between an inlet end 32 and an outlet end 30. The outlet end 30 is a funnel-shaped opening provided in a wall 31 of the housing 12 that separates the suction chamber 20a and the transfer chamber 18. The outlet end 30 includes an opening 33 (see FIG. 6) that substantially registers with the fan blade blades 26 of the blower 24. A series of four to ten, preferably five to eight, more preferably six, blower slots 36 are provided in the suction chamber 20a. The suction slots 36 are formed between adjacent structures of the housing 12 in the form of the dividers 38, the divider 22 and the housing wall 40.

Although not shown, an injector (like injector 420) may be mounted to the hood section 10a for distributing a chemical into the suction chamber 20a. The chemical may be distributed through the injector in a liquid state, which is later vaporized as it travels through the coating hood. Alternatively, the chemical may be distributed through the injector in a gaseous or vapor state.

Figure 6:
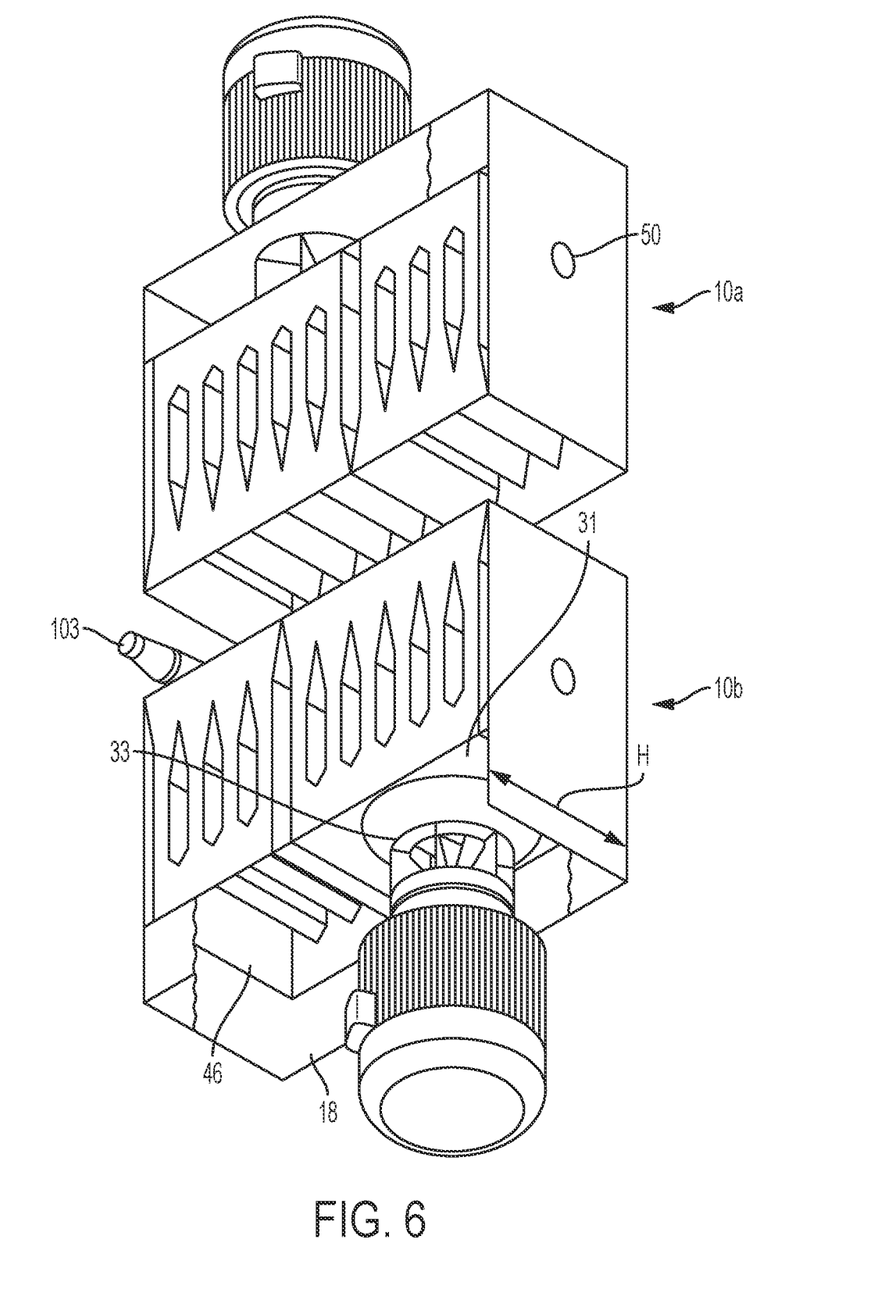

The blowing chamber 20b of the manifold portion 16 is partially enclosed by the walls of the housing 12 including divider 22. The blowing chamber 20b extends between an inlet end 46 and an outlet end 44. As best seen in FIG. 6, the inlet end 46 of the blowing chamber 20b opens into and is in fluid communication with the interior transfer chamber 18 of the base portion 14. A series of four to ten, preferably five to eight, and more preferably six, blowing slots 48 are provided in the blowing chamber 20b. The blowing slots 48 are formed between adjacent structures in the form of the dividers 38, the divider 22 and the housing wall 49.

Figure 5:
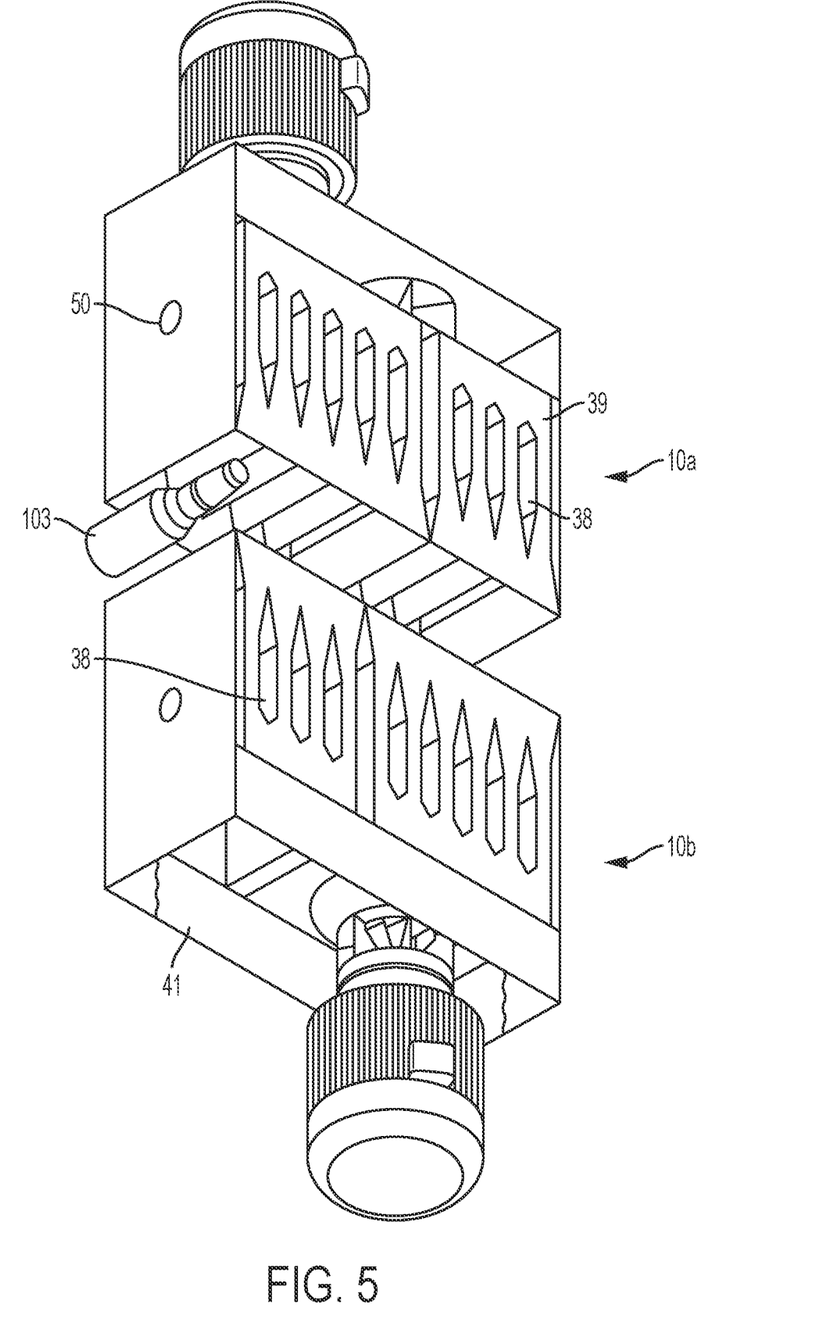
FIGS. 5 and 6 depict isometric views of a modular single vapor loop coating hood including two modular coating hood sections according to one embodiment of the instant invention.
Figure 7:
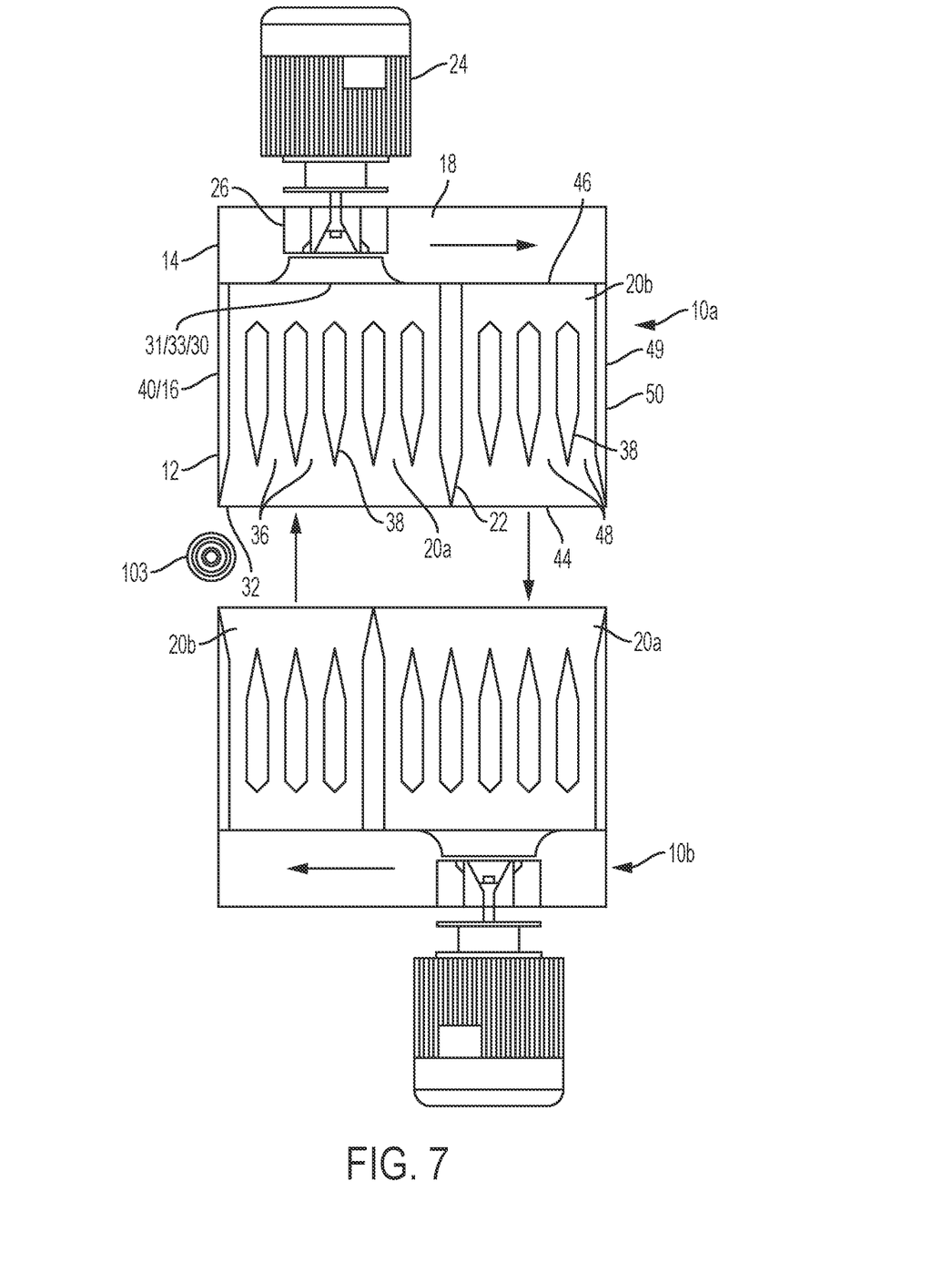
FIG. 7 depicts a top plan view of the modular coating hood of FIG. 5.
Figure 8:
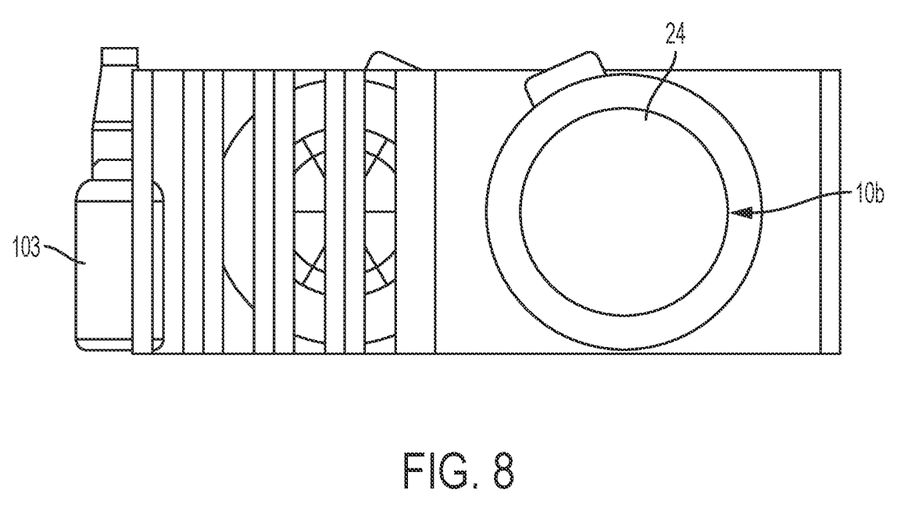
FIG. 8 depicts a side elevation view of the modular coating hood of FIG. 5.

Each divider 38 of the chambers 10a and 10b is substantially hull-shaped in cross section (as seen in FIG. 7) and extends along the height dimension 'H' (see FIG. 6) of the housing 12. As shown in FIG. 5, each divider 38 is connected to the top wall 39 and the bottom wall 41 of the housing 12. While the dividers 38 may be hollow, as shown, it should be understood that air is prevented from entering the interior of the dividers 38. The dividers 38 may be removably connected to the housing 12. It should also be understood that the shape and number of dividers 38 and corresponding suction slots 36 may vary from that which is shown and described and are contemplated to be within the scope of the invention.

Figure 9:
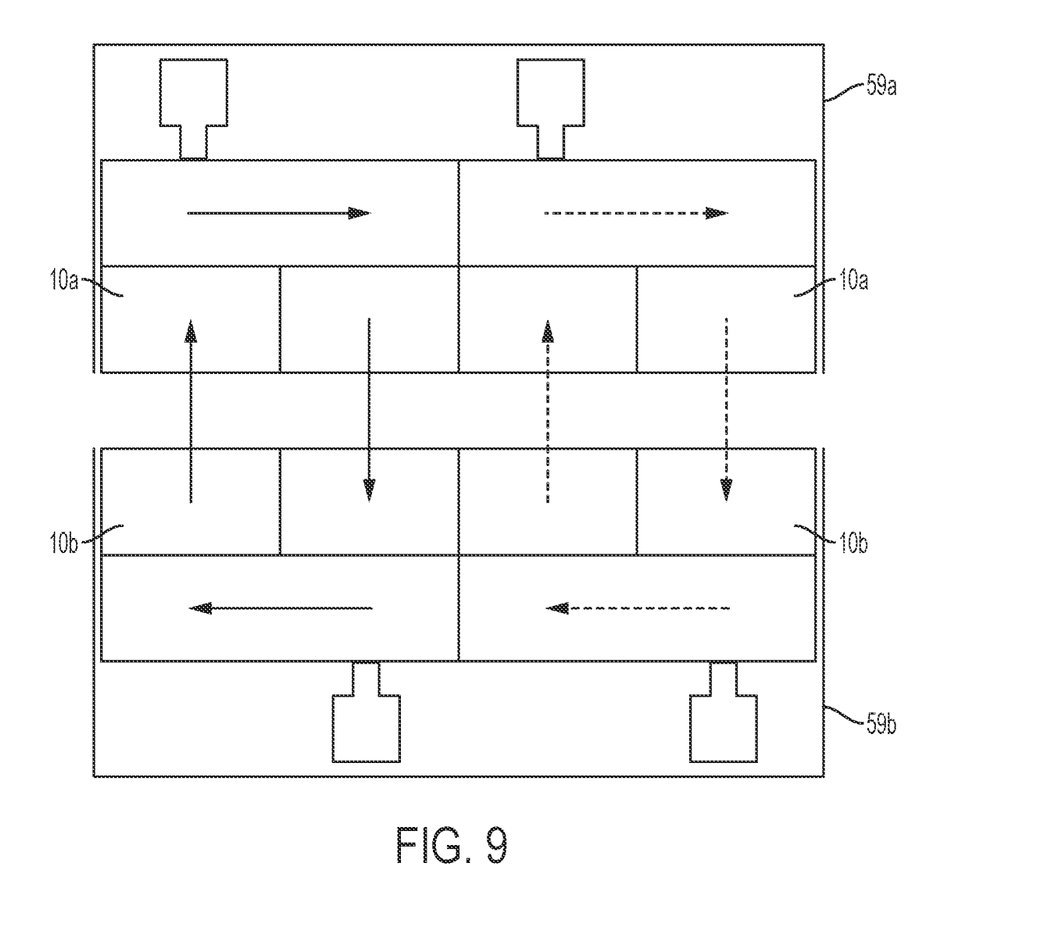
FIG. 9 depicts a top plan view of a modular double-vapor-loop coating hood including four modular coating hood sections.
Figure 10:
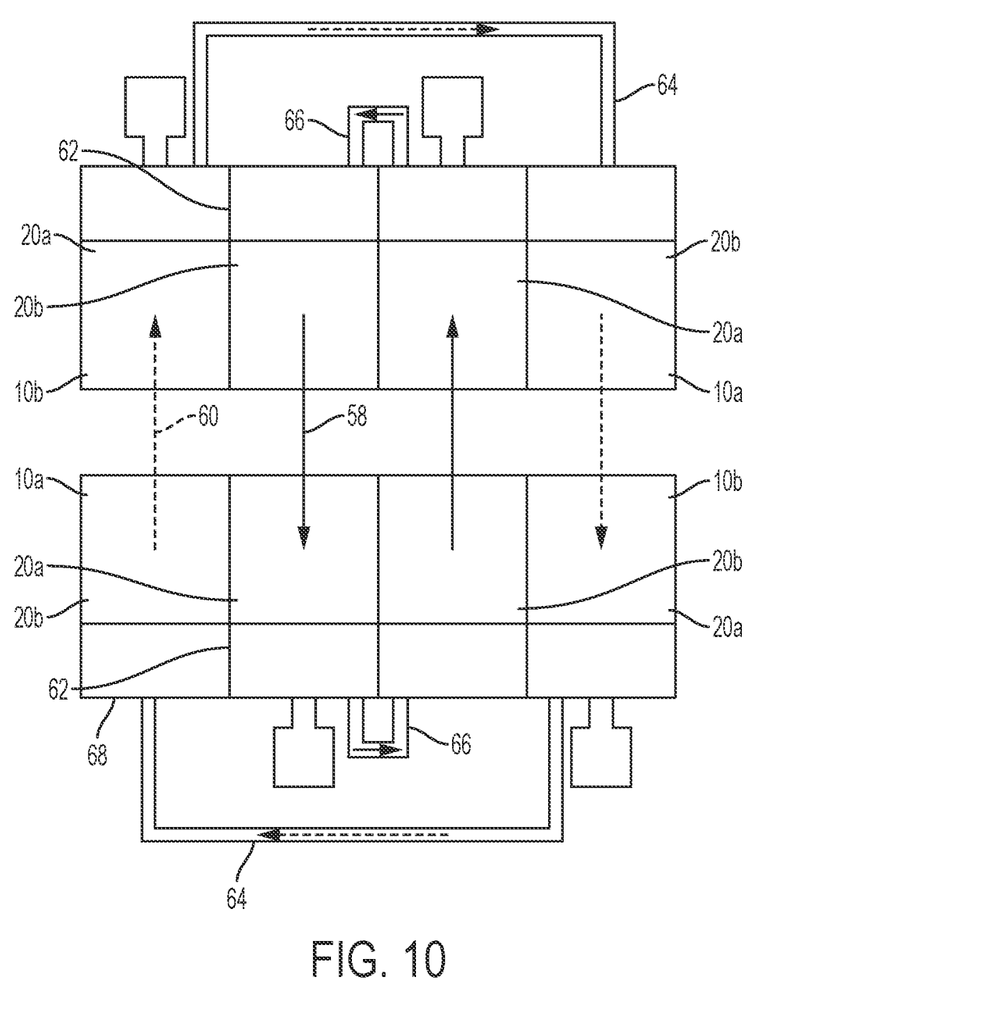
FIG. 10 depicts a top plan view of the double-vapor-loop modular coating hood of FIG. 9 that is modified to generate a primary loop and a recycle loop.

Each hood section 10a/10b includes means 50 for connecting to an adjacent hood section. Connected hood sections 10a/10b are shown in FIGS. 9 and 10. Means 50 is shown schematically in FIGS. 5 and 6. By way of non-limiting example, means 50 may be a connector, a slot, a tang, a tab, a bolt, an opening, a fastener, a screw, a raised surface, a clamp, a clip, a magnet, a protrusion, and/or any other fastening means that is/are known to those skilled in the art. Means 50 preferably provides a releasable and/or removeable connection between connected hood sections 10a/10b such that the hood sections may be connected or disconnected/disassembled as desired. However, means 50 could also provide a permanent connection, if so desired by an end user.

Means 50 is provided on the opposing side walls 40 and 49 of each hood section 10a/10b. Alternatively, means 50 may also be provided on top wall 39 and/or the bottom wall 41 of each hood section 10a/10b. One or more means 50 may be provided on each wall 39, 40, 41 and/or 49 for securing the connected hood sections 10a/10b. Means 50 may be provided on the corner(s) of a particular wall 39, 40, 41 and/or 49.

By virtue of the modular hood sections 10a/10b described herein, the coating hood manufacturer can produce substantially identical or identical hood modules that can be later attached together or removed by the customer to create a necessary hood length for a particular application. Following installation, hood sections 10a/10b can be removed from an existing installation to allow for different production speeds, or for replacement, repair or cleaning of a single hood section 10a/10b, as needed. Any number of modular hood sections 10a/10b may be connected together from two or more, at any time and as needed. Alternatively, a non-modular hood section (not shown) may be connected to one of the modular hood sections 10a/10b.

Although not shown, each modular hood section 10a/10b may include a handle or inset for lifting.

Operation of the coating hood 10 will now be described for the embodiment described above. The flow of fluid through the coating hood 10 is depicted by the arrows in FIG. 7. In operation, as shown by the arrows in FIG. 7, rotation of the fan blade of the blower 24 of the hood section 10a causes fluid to be delivered into the suction chamber 20a of the hood section 10a via inlet end 32 and then through the suction slots 36. Fluid is also delivered into the suction chamber 20a of the hood section 10a by virtue of the blowing action of the blower 24 of the hood section 10b. Referring still to the hood section 10a, the fluid is then distributed into the interior transfer chamber 18 via inlet end 30. The fluid is then delivered past the fan blades, into the blowing chamber 20b of the hood section 10a via the inlet end 46 and then through the blowing slots 48. The fluid is then distributed out of the blowing chamber 20b via the outlet end 44 and onto the bottle 103.

At the same time, rotation of the fan blade of the blower 24 of the hood section 10b causes fluid to be delivered into the suction chamber 20a of the hood section 10b via inlet end 32 and then through the suction slots 36. Fluid is also delivered into the suction chamber 20a of the hood section 10b by virtue of the blowing action of the blower 24 of the hood section 10a (as discussed above). The fluid is then distributed into the interior transfer chamber 18 of the hood section 10b via inlet end 30 of the hood section 10b. The fluid is then delivered past the fan blades, into the blowing chamber 20b of the hood section 10a via the inlet end 46 and then through the blowing slots 48. The fluid is then distributed out of the blowing chamber 20b via the outlet end 44 and onto the bottle 103.

Figure 11:
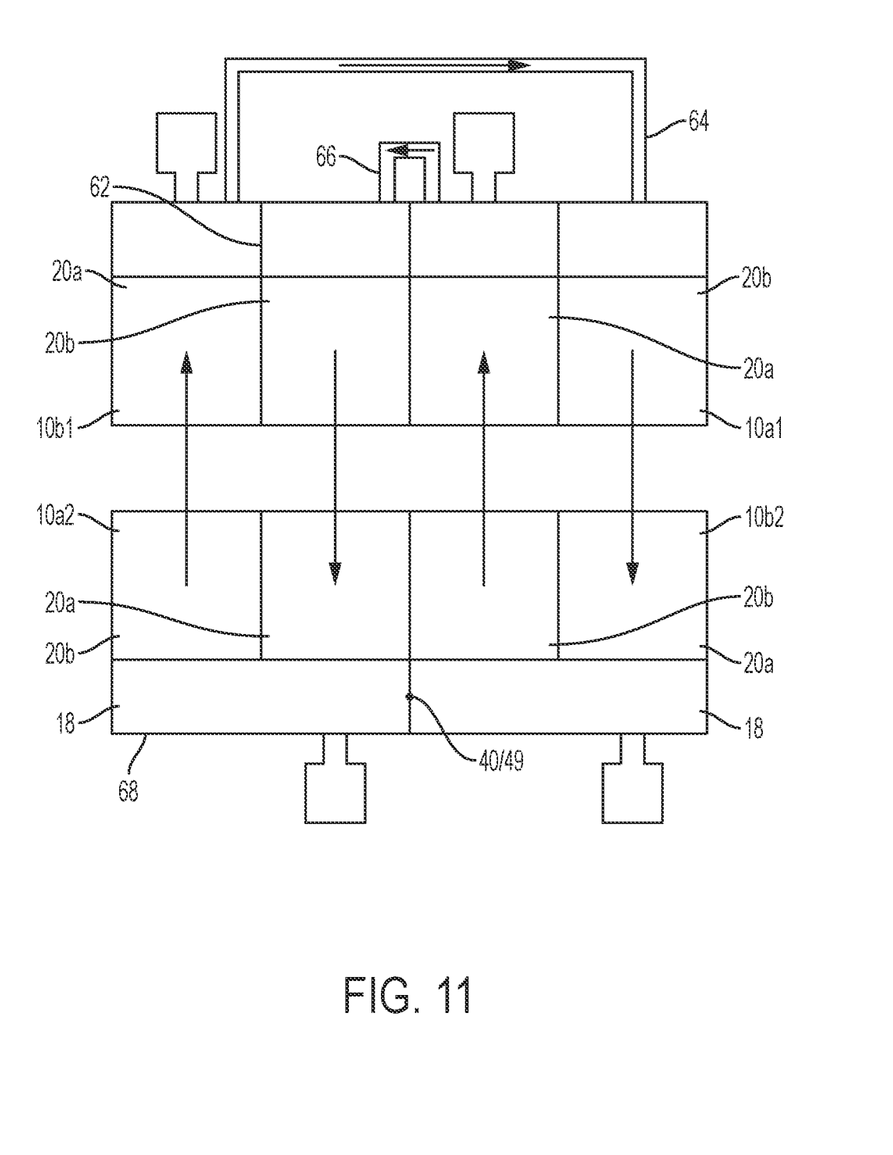
FIG. 11 depicts a top plan view of the double-vapor-loop modular coating hood of FIG. 9 that is modified to generate a continuous loop.

The coating hood sections 10a/10b may be arranged to provide a single primary loop, as shown in FIG. 7, or, the hood sections 10a/10b may be connected to one or more hood sections 10a/10b to create various other loop configuration embodiments as shown in FIGS. 9-11. The alternative loop configuration embodiments are described hereinafter, and it should be understood that only the primary differences between the alternative loop configuration embodiments and the coating hood of FIGS. 5-8 will be described.

FIG. 9 shows four hood sections 10a/10b that are connected to form two separate primary loops, as depicted by the arrows. In FIG. 9, one primary loop is depicted by solid line arrows, and the other primary loop is depicted by broken line arrows.

According to an embodiment of the invention, the first row of hood sections 10a/10b, which are shown at the top of FIG. 9, are housed within a frame 59a. Similarly, the second row of hood sections 10a/10b, which are shown at the bottom of FIG. 9, are housed within a frame 59b. The previously described means 50 on the individual hood sections 10a/10b may be connected to mating connecting means provided on the respective frames 59a/59b. The frames 59a/59b may be provided in a variety of different lengths, shapes and sizes. Although the frames 59a and 59b are not shown in the other coating hood embodiments, it should be understood that the frames 59a and 59b may be used with those coating hood embodiments. The frames 59a/59b are an optional feature of the invention.

FIG. 10 shows four hood sections 10a/10b that are connected to form both a primary loop 58 and a recycle loop 60. In FIG. 10, the recycle loop 60 is depicted by broken line arrows, whereas the primary loop 58 is depicted by solid line arrows.

To convert the coating hood of FIG. 9 into the coating hood of FIG. 10 having a recycle loop 60, one may, for example, (i) add a divider 62 in each base portion 14 to prevent the movement of fluid between adjacent chambers 20a and 20b of a respective coating hood section 10a/10b, (ii) add external conduits 64 between the outermost chambers 20a/20b in order to create the recycle loop 60, and (iii) add external conduits 66 between the innermost chambers 20a/20b in order to create the primary loop 58. The external conduits 64 and 66 are tubes that connect to openings formed in the rear wall 68 of the housings 12.

If a user does not desire to incorporate a recycle loop, then the dividers 62 and the conduits 64 and 66 may be removed, and the openings in the rear wall 68 may be concealed by one or more plates (not shown) to return the coating hood back to its configuration shown in FIG. 9.

FIG. 11 shows four hood sections 10a/10b that are connected to form a single continuous loop. The coating hood of FIG. 11 is similar to the coating hood of FIG. 10, with the exception that the second (lower) row of coating hood sections 10a2/10b2 in FIG. 11 does not include the external conduits 64 and 66 and the dividers 62.

In operation, as depicted by the arrows in FIG. 11, by virtue of the blowers, fluid travels from chamber 20b of hood section 10a1, across the bottles and into chamber 20a of hood section 10b2, into the transfer chamber 18 of hood section 10b2, to chamber 20b of hood section 10b2 and across the bottles and into chamber 20a of hood section 10a1, through external conduit 66, into chamber 20b of hood section 10b1, across the bottles and into chamber 20a of hood section 10a2, into the transfer chamber 18 of hood section 10a2, to chamber 20b of hood section 10a2, across the bottles and into chamber 20a of hood section 10b1, through the external conduit 64 and finally returned to chamber 20b of hood section 10a1.

Those having ordinary skill in the art will recognize that the coating hood sections 10a/10b may be configured and arranged in a variety of ways to achieve any desired purpose.

Within this specification embodiments have been described in a way which enables a clear and concise specification to be written, but it is intended and will be appreciated that embodiments may be variously combined or separated without parting from the invention. For example, it will be appreciated that all preferred features described herein are applicable to all aspect of the invention described herein.

Numerous variations, changes and substitutions will occur to those skilled in the art without departing from the spirit of the invention. Accordingly, it is intended that the appended claims cover all such variations as fall within the spirit and scope of the invention.

What is claimed is:

1. A modular apparatus for coating glass articles with a chemical compound, said modular apparatus comprising: a coating hood section (10a) including a series of interconnected walls (12) defining an interior chamber (18, 20a, 20b) having an inlet (32) and an outlet (44), a blower (24) positioned at least partially in the interior chamber (18, 20a, 20b) to carry air from the inlet (32) towards the outlet (44); a plurality of dividers (38) that are removably positioned within the interior chamber (18, 20a, 20b), wherein each divider (38) of the plurality of dividers (38) is positioned either between the inlet (32) and the blower (24) or between the blower (24) and the outlet (44) for directing air through the coating hood section (10a); and means (50) for connecting the coating hood section (10a) to a substantially identical coating hood section (10b), said means (50) for connecting being defined on at least one of the interconnected walls (12) of the coating hood section (10a);

wherein each divider (38) extends directly from a top wall (39) of said coating hood section (10a) to a bottom wall (41) of said coating hood section (10a); wherein said plurality of dividers are removably connected to the coating hood section (10a); wherein the top wall (39) includes a plurality of openings, which each opening of the plurality of openings leads directly into one respective divider (38) of said plurality of dividers.

2. The modular apparatus of claim 1, wherein said means (50) for connecting are positioned on opposing side walls of the coating hood section.

3. The modular apparatus of claim 1, wherein said means for connecting are selected from the group consisting of a connector, a slot, a tang, a tab, a bolt, an opening, a fastener, a screw, a raised surface, a clamp, a clip, a magnet, and a protrusion.

4. The modular apparatus of claim 1, wherein said substantially identical apparatus (10b) comprises said means (50) for connecting, and said means (50) for connecting on said substantially identical coating hood section (10b) are configured to be releasably connected to said means (50) for connecting on said coating hood section (10a).

5. The modular apparatus of claim 1, wherein the interior chamber (18, 20a, 20b) comprises a suction chamber (20a) communicating with said inlet (32), and a blowing chamber (20b) communicating with said outlet (44).

6. The modular apparatus of claim 5, wherein the interior chamber (18, 20a, 20b) comprises a transfer chamber (18) communicating with said suction chamber (20a) and said blowing chamber (20b).

7. The modular apparatus of claim 6, wherein the blower (24) is at least partially positioned in the transfer chamber (18).

8. The modular apparatus of claim 5, wherein the suction chamber (20a) includes a series of individual slots (36) through which the chemical compound passes, and the blowing chamber (20b) includes a series of individual slots (36) through which the chemical compound passes.

9. The modular apparatus of claim 5, wherein an injector (420) is positioned to deliver the chemical compound into the blowing chamber (20b).

10. The modular apparatus of claim 5, further comprising a chamber divider (22) positioned between the blowing chamber (20b) and the suction chamber (20a).

11. The modular apparatus of claim 6, further comprising a wall (31) dividing the transfer chamber (18) from the blowing chamber (20b) and the suction chamber (20a).

12. The modular apparatus of claim 1, wherein each divider (38) of the plurality of dividers (38) has a pointed leading edge and a pointed trailing edge, wherein the pointed leading edge and the pointed trailing edge each extends between the top wall (39) and the bottom wall (41) of said coating hood section (10a).

13. The modular apparatus of claim 1, wherein each divider (38) of the plurality of dividers (38) has a hull shape, as viewed in cross-section.

14. The modular apparatus of claim 1, wherein the dividers (38) are arranged in a row and parallel to each other.

15. The modular apparatus of claim 1, wherein the inlet is positioned to face the glass articles and forms an opening through which air is delivered into the interior chamber, and the outlet is also positioned to face the glass articles and defines another opening through which air is exhausted from the chamber, and wherein the inlet and the outlet are disposed on a same side of said coating hood section.

16. The modular apparatus of claim 1, wherein the pointed leading edge and the pointed trailing edge are aligned with each other in a direction of airflow.

17. The modular apparatus of claim 1, wherein the inlet (32) and the outlet (44) are disposed on a front face of the coating hood section (10a) that extends in a lengthwise direction between opposing side walls (40, 49) of the coating hood section (10a),
wherein said connecting means (50) are positioned on each of the opposing side walls (40, 49) of the coating hood section (10a),
wherein when said coating hood section (10a) and said substantially identical coating hood section (10b) are aligned in the lengthwise direction such that one of the opposing side walls (40/49) of said coating hood section (10a) is abutted against one of the opposing side walls (40/49) of said substantially identical coating hood section (10b), said connecting means (50) on said one of the opposing side walls (40/49) of said coating hood section (10a) is configured to be releasably and directly connected to said connecting means (50) on said one of the opposing side walls (40/49) of said substantially identical coating hood section (10b).

* * * * *